United States Patent
Josefiak et al.

(10) Patent No.: US 9,322,921 B2
(45) Date of Patent: Apr. 26, 2016

(54) COMMUNICATIONS DEVICE WITH OSCILLATOR CALIBRATION AND RELATED METHODS

(75) Inventors: Brent Josefiak, Rochester, NY (US); Brian Padalino, Rochester, NY (US)

(73) Assignee: HARRIS CORPORATION, Melbourne, FL (US)

( * ) Notice: Subject to any disclaimer, the term of this patent is extended or adjusted under 35 U.S.C. 154(b) by 784 days.

(21) Appl. No.: 13/613,722

(22) Filed: Sep. 13, 2012

(65) Prior Publication Data
US 2014/0070990 A1 Mar. 13, 2014

(51) Int. Cl.
*G01S 19/23* (2010.01)
*H03L 1/00* (2006.01)
*H03L 1/02* (2006.01)

(52) U.S. Cl.
CPC .............. *G01S 19/23* (2013.01); *G01S 19/235* (2013.01); *H03L 1/00* (2013.01); *H03L 1/026* (2013.01); *H03L 1/028* (2013.01); *H03J 2200/11* (2013.01); *H03J 2200/12* (2013.01); *H03J 2200/29* (2013.01)

(58) Field of Classification Search
CPC ................................ G01S 19/23; G01S 19/235
See application file for complete search history.

(56) References Cited

U.S. PATENT DOCUMENTS

| | | | |
|---|---|---|---|
| 5,311,194 A | 5/1994 | Brown | |
| 5,654,718 A | 8/1997 | Beason et al. | |
| 5,659,884 A * | 8/1997 | Daughtry, Jr. ........... | H03B 5/32 331/158 |
| 5,878,369 A | 3/1999 | Rudow et al. | |
| 6,470,242 B1 | 10/2002 | Rudow et al. | |
| 6,472,943 B1 * | 10/2002 | Soong et al. ............ | 331/44 |
| 6,662,107 B2 * | 12/2003 | Gronemeyer ........... | G01S 19/23 342/357.63 |
| 7,095,802 B1 * | 8/2006 | Wardrop et al. .............. | 375/316 |
| 7,548,153 B2 | 6/2009 | Gravelle et al. | |
| 7,791,418 B2 * | 9/2010 | Gros ......................... | G04G 3/02 331/156 |
| 7,809,518 B2 | 10/2010 | Zhu et al. | |

(Continued)

FOREIGN PATENT DOCUMENTS

| EP | 1933468 | * 6/2008 | .............. H04B 1/38 |
|---|---|---|---|
| WO | 03073629 | 9/2003 | |

(Continued)

OTHER PUBLICATIONS

Symmetricon, Heartbeat of the Net—58540A GPS Time and Frequency Reference Receiver, 2000, http://www.leapsecond.com/museum/hp58540a/ds-58540a.pdf.*

(Continued)

*Primary Examiner* — Gregory C Issing
(74) *Attorney, Agent, or Firm* — Allen, Dyer, Doppelt, Milbrath & Gilchrist, P.A.

(57) ABSTRACT

A communications device includes a housing, an antenna carried by the housing, an oscillator carried by the housing to generate a reference signal, and an RF receiver carried by the housing, and coupled to the antenna and the oscillator, the RF receiver demodulating a received signal from the antenna based upon the reference signal. The communications device also includes a GPS receiver carried by the housing to generate a calibration signal, a temperature sensor carried by the housing to generate a sensed temperature value, and a processor carried by the housing and coupled to the oscillator, the RF receiver, the GPS receiver, and the temperature sensor. The processor may enter an oscillator calibration mode based upon the sensed temperature value for selectively calibrating the oscillator based upon the calibration signal.

24 Claims, 3 Drawing Sheets

(56) References Cited

U.S. PATENT DOCUMENTS

| | | |
|---|---|---|
| 8,160,491 B2 | 4/2012 | Touboul et al. |
| 8,736,394 B2 * | 5/2014 | Kowada .................. 331/176 |
| 2003/0184399 A1 | 10/2003 | Lanoue et al. |
| 2003/0225514 A1 | 12/2003 | Lokshin et al. |
| 2006/0267703 A1 | 11/2006 | Wang et al. |
| 2008/0061891 A1 | 3/2008 | Hongo |
| 2008/0164952 A1 | 7/2008 | Babitch |
| 2010/0029295 A1 | 2/2010 | Touboul et al. |
| 2011/0298548 A1 | 12/2011 | Jackson |
| 2012/0050100 A1 | 3/2012 | Huang et al. |
| 2012/0057624 A1 | 3/2012 | Lo |
| 2014/0004800 A1 * | 1/2014 | Wu et al. .................. 455/67.11 |

FOREIGN PATENT DOCUMENTS

| | | | |
|---|---|---|---|
| WO | 2004055543 | 7/2004 | |
| WO | WO 2011086976 A1 * | 7/2011 | ............. H03L 1/022 |

OTHER PUBLICATIONS

"RF-7800T-HH, Situational Awareness Video Receiver (SAVR), Receive Full Motion Video and Sensor Data from Multiple Manned and Unmanned Systems," Harris Corporation, RF Communications, Rochester, NY, 2011, 2 pages.

"GPS Disciplined Oscillator," Wikipedia, Jun. 12, 2012, pp. 1-2.

* cited by examiner

COMMUNICATIONS DEVICE WITH OSCILLATOR CALIBRATION AND RELATED METHODS

FIELD OF THE INVENTION

The present invention relates to the field of communications, and, more particularly, to calibration of oscillators in communications devices and related methods.

BACKGROUND OF THE INVENTION

Mobile communications devices have become an integral part of society over the last two decades. Indeed, more than eighty-two percent of Americans own a mobile communications device. The typical mobile communications device includes an antenna, and a transceiver coupled to the antenna. The transceiver and the antenna cooperate to transmit and receive communications signals.

The typical transceiver includes a power amplifier for amplifying low voltage signals for transmission via the antenna, and a local oscillator providing a reference frequency signal. The typical mobile wireless communications device uses the reference frequency signal to demodulate a received signal transmitted at a carrier frequency for subsequent baseband processing. The reference frequency signal is also used in the uplink transmission path for modulating a baseband signal and preparing it for transmission.

A typical local oscillator may comprise a crystal oscillator. In these oscillators, the natural resonance of the crystal is used as a basis to create a known repeating electronic signal, such as a clock signal. For example, quartz crystals are commonly used in time instruments, such as a quartz movement timepiece. Typically, the resonance of the crystal is very accurate and provides a precise basis. Nevertheless, the performance of the crystal can be affected by aging and temperature conditions, which can adversely affect the performance of a communications device using the crystal for the basis of its local oscillator. For example, one common oscillator used in communications devices is a voltage controlled crystal oscillator.

Because of this variance in the oscillator, some communications devices apply a calibration approach. In other words, these communications device periodically calibrate their oscillators using another reference signal, hopefully immune to the temperature and aging effects. In one approach, the communications device is directed to transmit a test tone at a previously established frequency. The output of the communications device is recorded and tested for accuracy by external equipment. Any defects in the transmitted test tone are used to recalibrate the oscillator in the communications device. Because of the need to use external equipment, communications devices calibrated with this approach are usually taken out of service. In communications devices that include only receive capabilities, the above approach may not be a viable option.

Moreover, for devices used in the field, the typical approach of disassembly and using signal probes to test the local oscillator may not be practical. Indeed, in these approaches, the device is again temporarily put out of service and sent to an advanced repair facility.

In one approach disclosed in U.S. Patent Application No. 2012/0050100 to Huang et al., the communications device calibrates the oscillator using a global positioning system (GPS) device. In particular, the communications device uses a pulse per second signal from the GPS device to calibrate the oscillator.

SUMMARY OF THE INVENTION

In view of the foregoing background, it is therefore an object of the present invention to provide a communications device with an accurate oscillator.

This and other objects, features, and advantages in accordance with the present invention are provided by a communications device comprising a housing, an antenna carried by the housing, and an oscillator carried by the housing and configured to generate a reference signal. The communications device also includes a radio frequency (RF) receiver carried by the housing, and coupled to the antenna and the oscillator, the RF receiver configured to demodulate a received signal from the antenna based upon the reference signal. The communications device also includes a GPS receiver carried by the housing and configured to generate a calibration signal, a temperature sensor carried by the housing and configured to generate a sensed temperature value, and a processor carried by the housing and coupled to the oscillator, the RF receiver, the GPS receiver, and the temperature sensor. The processor is configured to enter an oscillator calibration mode based upon the sensed temperature value for selectively calibrating the oscillator based upon the calibration signal. Advantageously, the communications device may adjust the oscillator based upon environmental conditions, such as temperature.

More specifically, the processor may be configured to enter the oscillator calibration mode when the sensed temperature value exceeds a temperature threshold value. The processor, when in the oscillator calibration mode, may be configured to count a number of oscillations in the reference signal between first and second reference points in the calibration signal, and compare the number of oscillations with a set calibrated value. The processor may also enter the oscillator calibration mode when a lapsed time value from a prior calibration exceeds an ageing threshold value.

In some embodiments, the oscillator may comprise a voltage controlled crystal oscillator. The processor may selectively calibrate the voltage controlled crystal oscillator by at least adjusting a trim voltage thereof.

Additionally, the processor may selectively calibrate the oscillator when the GPS receiver is in a GPS signal lock mode. The RF receiver may comprise an RF receive only device. For example, the GPS receiver may be configured to generate the calibration signal comprising a pulse per second (PPS) signal. Also, the communications device may further comprise a display carried by the housing and coupled to the processor, the received signal comprising a video signal, and the processor may be configured to render the video signal on the display.

Another aspect is directed to a method of calibrating a communications device including an oscillator generating a reference signal, and an RF receiver coupled to the oscillator for demodulating a received signal based upon the reference signal. The method comprises generating a calibration signal with a GPS receiver in the communications device, generating a sensed temperature value with a temperature sensor in the communications device, and entering an oscillator calibration mode for selectively calibrating the oscillator based upon the calibration signal when the sensed temperature value exceeds a temperature threshold value.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
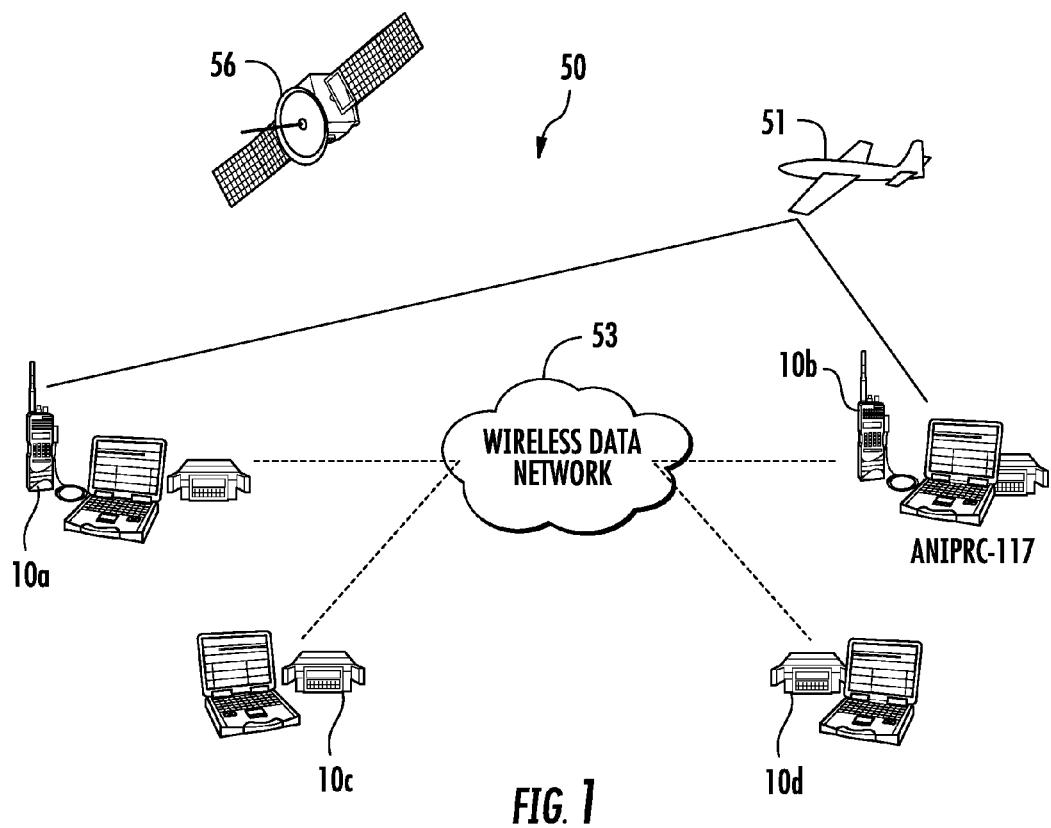
FIG. 1 is a schematic diagram of a communication system, according to the present invention.
Figure 3:
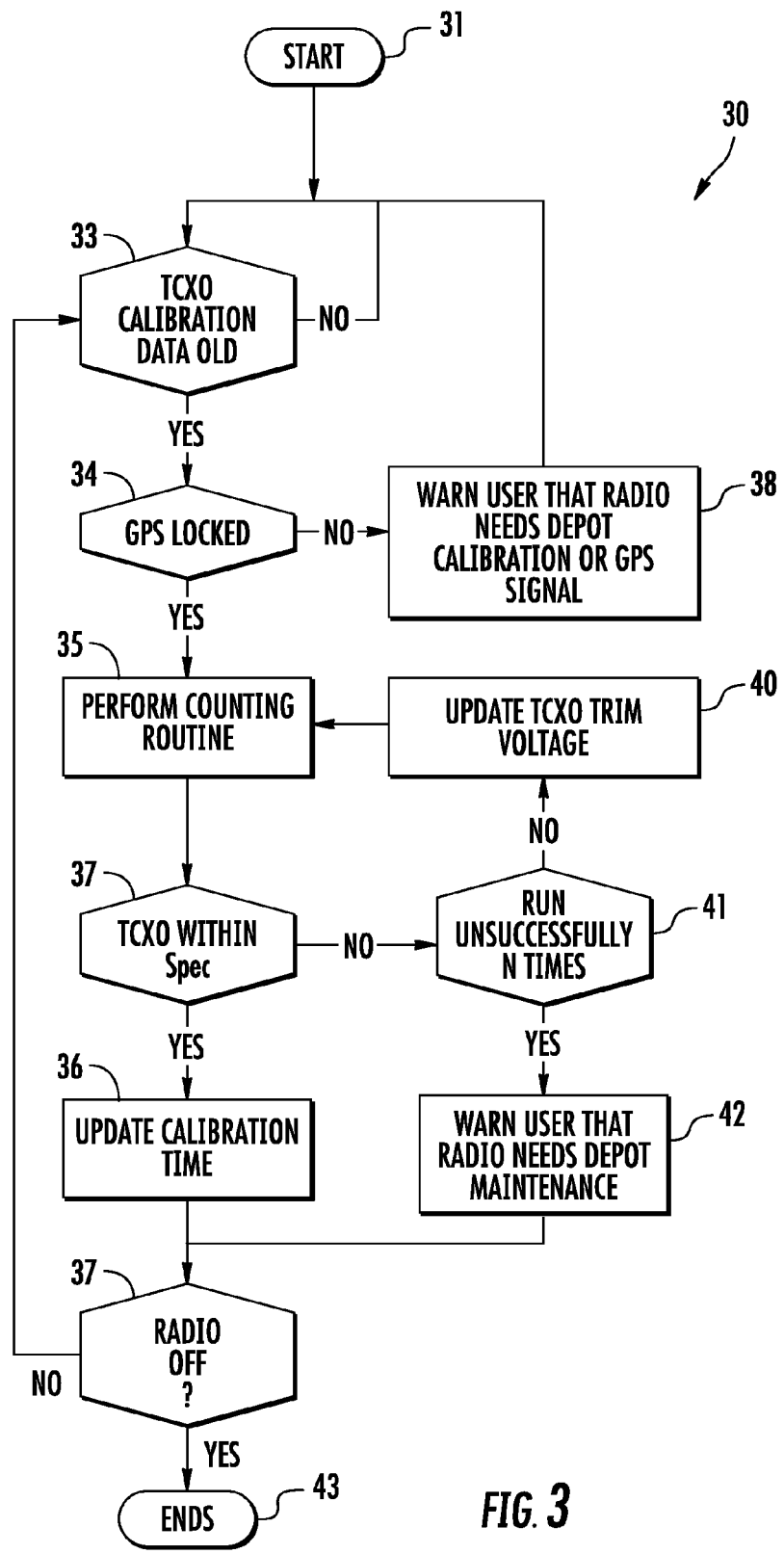
FIG. 3 is a flowchart illustrating operation of a communications device from the communication system of FIG. 1.

Referring initially to FIGS. 1 and 3, a communication system 50 according to the present invention is now described. The communication system 50 illustratively includes a wireless data network 53, and a plurality of communications devices 10a-10d exchanging data with the wireless data network. Also, a flowchart 30 describes operation of the communications devices 10a-10d and begins at Block 31.

The communication system 50 also includes an unmanned aerial vehicle (UAV) 51 also communicating with the wireless data network 53, and a GPS satellite 56 providing GPS services to the communication system 50. The UAV 51 provides surveillance data to users of the communications devices 10a-10d. As will be appreciated, the communication system 50 may include additional components (not shown) and/or may not necessarily include each illustrated component.

Figure 2:
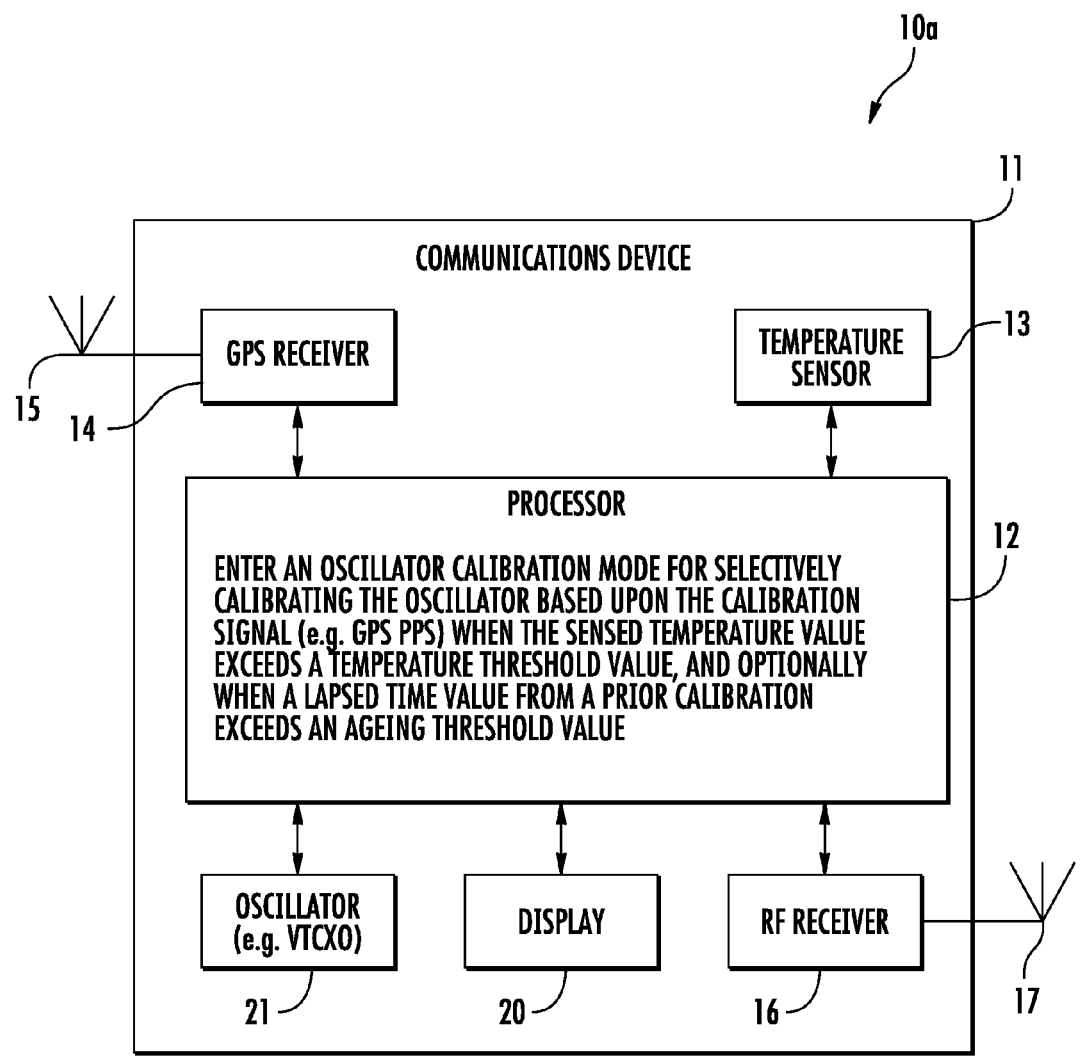
FIG. 2 is a schematic diagram of a communications device from the communication system of FIG. 1.

Referring now additionally to FIG. 2, the communications device 10a includes a housing 11, an RF antenna 17 carried by the housing, and an oscillator 21 carried by the housing and configured to generate a reference signal. The communications device also includes an RF receiver 16 carried by the housing 11, and coupled to the RF antenna 17 and the oscillator 21. For example, the oscillator 21 may comprise a voltage controlled and temperature compensated crystal oscillator (VCTCXO) or a voltage controlled crystal oscillator (VCXO). The RF receiver 16 is configured to demodulate a received signal from the RF antenna 17 based upon the reference signal. The communications device 10a also includes a GPS receiver 14 carried by the housing 11 and configured to generate a calibration signal, and a GPS antenna 15 coupled thereto. For example, the calibration signal may comprise a PPS signal.

The communications device 10a includes a temperature sensor 13 carried by the housing 11 and configured to generate a sensed temperature value. The communications device 10a also includes a processor 12 carried by the housing 11 and coupled to the oscillator 21, the RF receiver 16, the GPS receiver 14, and the temperature sensor 13. Also, the communications device 10a illustratively includes a display 20 carried by the housing 11 and coupled to the processor 12. In embodiments where the received signal comprises a video signal, the processor 12 may be configured to render the video signal on the display 20. In the illustrated embodiment, each communications device 10a-10d may receive a signal comprising a video signal from the UAV 51.

In some embodiments, the communications device 10a may comprise a handheld portable communications device. For example, the communications device 10a may comprise an RF-7800T, as available from the Harris Corporation of Melbourne, Fla., modified with the teachings disclosed herein.

As discussed above, during typical use, the oscillator 21 may experience misalignment or drift due to environmental conditions or simply age. The processor 12 of communications device 10a automatically monitors the conditions of use to determine if the oscillator 21 has become inaccurate and performs a self-calibration if needed.

More specifically, the processor 12 is configured to enter an oscillator calibration mode for selectively calibrating the oscillator 21 based upon the calibration signal when the sensed temperature value exceeds a temperature threshold value. Also, the processor 12 may enter the oscillator calibration mode when the sensed temperature value drops below a temperature floor value. The processor 12 may also enter the oscillator calibration mode when a lapsed time value from a prior calibration exceeds an ageing threshold value (Block 33). For example, the lapsed time value may be measured from the last calibration or from factory calibration during manufacturer. In VCXO embodiments, the processor 12 may selectively calibrate the oscillator 21 by at least adjusting a trim voltage thereof.

More specifically, the processor 12, when in the oscillator calibration mode, may be configured to count a number of oscillations in the reference signal between first and second reference points in the calibration signal, and compare the number of oscillations with a set calibrated value stored in a memory (not shown) therein (Blocks 35, 36-37). The processor 12 will enter the oscillator calibration mode and attempt to calibrate the oscillator 21 again if the first attempt fails (Block 41). If the self-calibration routine fails a number of times, the processor 12 will prompt the user on the display 20 to return the communications device 10a for service (Block 42).

Additionally, the processor 12 may selectively calibrate the oscillator 21 when the GPS receiver 14 is in a GPS signal lock mode (Block 34). In some embodiment, the processor 12 may enter the oscillator calibration mode automatically when a GPS lock is secured. Indeed, if the GPS receiver 14 cannot obtain a GPS signal lock, the processor 12 presents a prompt on the display 20 for the user to return the communications device 10a for service or await a GPS signal lock (Block 38). The self-calibration method disclosed herein operates constantly while the communications device 10a is operational, thereby providing improved accuracy and performance (Blocks 37, 43).

In some embodiments, the RF receiver 16 may comprise an RF receive only device, i.e. it does not include transmit capability. Advantageously, the herein disclosed method provides accurate and automatic oscillator 21 calibration while the typical receive-transmit approaches cannot be used.

Another aspect is directed to a method of calibrating a communications device 10a including an oscillator 21 generating a reference signal, and an RF receiver 16 coupled to an antenna 17 and the oscillator for demodulating a received signal from the antenna based upon the reference signal. The method comprises generating a calibration signal with a GPS receiver 14 in the communications device 10a, generating a sensed temperature value with a temperature sensor 13 in the communications device, and entering an oscillator calibration mode for selectively calibrating the oscillator 21 based upon the calibration signal when the sensed temperature value exceeds a temperature threshold value.

Also, in one embodiment, a plurality of communications devices 10a-10d placed under test can be simultaneously calibrated using a GPS repeater setup. In particular, the communications devices 10a-10d are arranged indoors for simultaneous calibration of the communications devices, and the GPS repeater retransmits GPS signals to provide the needed GPS lock for calibration, as disclosed herein.

Advantageously, the self-calibration method disclosed herein provides a highly accurate and reliable oscillator 21. Specifically, the PPS signal from the GPS receiver 14 is provided with an uncertainty of 92 ns. This provides an oscillator uncertainty, where the oscillator frequency is 19.2 MHz, for example (52 ns between oscillations), of 19.2 MHz+/−2 Hz. Taking on the worst case error (2 Hz) for self-calibration for a 19.2 MHz clock, this provides an oscillator with 0.1 PPM accuracy. When applied to the above discussed RF-7800T device, the disclosed method provided an oscillator with 0.05 PPM accuracy.

With the self-calibration method of the communications device 10a, the external equipment of typical calibration approaches is no longer needed, enabling easy calibration in the field. In one embodiment, the self-calibration can be integrated into a built-in test (BIT) of the communications device 10a. For example, the self-calibration could be executed upon start-up. Indeed, the above described method may operate as a background operation, using a limited amount of the processor 12 resources. Helpfully, due to the self-calibration method, the communications device 10a does not have to be returned for service as often, thereby leading to greater duty cycles. Yet further, the self-calibration method of the communications device 10a permits use of cheaper VCXO oscillators in extreme temperature environments.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A communications device comprising:
   a housing;
   an antenna carried by said housing;
   an oscillator carried by said housing and configured to generate a reference signal;
   a radio frequency (RF) receiver carried by said housing, and coupled to said antenna and said oscillator, said RF receiver configured to demodulate a received signal from said antenna based upon the reference signal;
   a global positioning system (GPS) receiver carried by said housing and configured to generate a calibration signal;
   a temperature sensor carried by said housing and configured to generate a sensed temperature value; and
   a processor carried by said housing and coupled to said oscillator, said RF receiver, said GPS receiver, and said temperature sensor, said processor configured to
      enter an oscillator calibration mode based upon the sensed temperature value for selectively calibrating said oscillator based upon the calibration signal, and
      enter the oscillator calibration mode when a lapsed time value from a prior calibration exceeds an ageing threshold value.

2. The communications device of claim 1 wherein said processor is configured to enter the oscillator calibration mode when the sensed temperature value exceeds a temperature threshold value.

3. The communications device of claim 1 wherein said processor, when in the oscillator calibration mode, is configured to:
   count a number of oscillations in the reference signal between first and second reference points in the calibration signal; and
   compare the number of oscillations with a set calibrated value.

4. The communications device of claim 1 wherein said processor also enters the oscillator calibration mode when a lapsed time value from a prior calibration exceeds an ageing threshold value.

5. The communications device of claim 1 wherein said oscillator comprises a voltage controlled crystal oscillator.

6. The communications device of claim 5 wherein said processor selectively calibrates said voltage controlled crystal oscillator by at least adjusting a trim voltage thereof.

7. The communications device of claim 1 wherein said processor selectively calibrates the oscillator when said GPS receiver is in a GPS signal lock mode.

8. The communications device of claim 1 wherein said RF receiver comprises an RF receive only device.

9. The communications device of claim 1 wherein said GPS receiver is configured to generate the calibration signal comprising a pulse per second (PPS) signal.

10. The communications device of claim 1 further comprising a display carried by said housing and coupled to said processor; wherein the received signal comprises a video signal; and wherein said processor is configured to render the video signal on said display.

11. A communications device comprising:
    a housing;
    an antenna carried by said housing;
    an oscillator carried by said housing and configured to generate a reference signal;
    a radio frequency (RF) receiver carried by said housing, and coupled to said antenna and said oscillator, said RF receiver configured to demodulate a received signal from said antenna based upon the reference signal;
    a global positioning system (GPS) receiver carried by said housing and configured to generate a calibration signal;
    a temperature sensor carried by said housing and configured to generate a sensed temperature value; and
    a processor carried by said housing and coupled to said oscillator, said RF receiver, said GPS receiver, and said temperature sensor, said processor configured to
       enter an oscillator calibration mode for selectively calibrating said oscillator based upon the calibration signal when the sensed temperature value exceeds a temperature threshold value, and also enter the oscillator calibration mode when a lapsed time value from a prior calibration exceeds an ageing threshold value,
       when in the oscillator calibration mode, count a number of oscillations in the reference signal between first and second reference points in the calibration signal, and compare the number of oscillations with a set calibrated value, and
       enter the oscillator calibration mode when a lapsed time value from a prior calibration exceeds an ageing threshold value, the lapsed time value being measured from a date of manufacture.

12. The communications device of claim 11 wherein said oscillator comprises a voltage controlled crystal oscillator.

13. The communications device of claim 12 wherein said processor selectively calibrates said voltage controlled crystal oscillator by at least adjusting a trim voltage thereof.

14. The communications device of claim 11 wherein said processor selectively calibrates the oscillator when said GPS receiver is in a GPS signal lock mode.

15. The communications device of claim 11 wherein said RF receiver comprises an RF receive only device.

16. The communications device of claim 11 wherein said GPS receiver is configured to generate the calibration signal comprising a pulse per second (PPS) signal.

17. The communications device of claim 11 further comprising a display carried by said housing and coupled to said processor; wherein the received signal comprises a video signal; and wherein said processor is configured to render the video signal on said display.

18. A method of calibrating a communications device including an oscillator generating a reference signal, and a radio frequency (RF) receiver coupled to the oscillator for demodulating a received signal based upon the reference signal, the method comprising:
 generating a calibration signal with a global positioning system (GPS) receiver in the communications device;
 generating a sensed temperature value with a temperature sensor in the communications device;
 entering an oscillator calibration mode based upon the sensed temperature value for selectively calibrating the oscillator based upon the calibration signal; and
 entering the oscillator calibration mode when a lapsed time value from a prior calibration exceeds an ageing threshold value.

19. The method of claim 18 further comprising entering the oscillator calibration mode when the sensed temperature value exceeds a temperature threshold value.

20. The method of claim 18 further comprising, when in the oscillator calibration mode, counting a number of oscillations in the reference signal between first and second reference points in the calibration signal, and comparing the number of oscillations with a set calibrated value.

21. The method of claim 18 further comprising entering the oscillator calibration mode when a lapsed time value from a prior calibration exceeds an ageing threshold value.

22. The method of claim 18 wherein the oscillator comprises a voltage controlled crystal oscillator; and further comprising selectively calibrating a trim voltage of the voltage controlled crystal oscillator.

23. The method of claim 18 further comprising selectively calibrating the oscillator when the GPS receiver is in a GPS signal lock mode.

24. The method of claim 18 further comprising generating the calibration signal to comprise a pulse per second (PPS) signal.

* * * * *